US009997510B2

(12) United States Patent
Tu et al.

(10) Patent No.: US 9,997,510 B2
(45) Date of Patent: Jun. 12, 2018

(54) SEMICONDUCTOR DEVICE LAYOUT STRUCTURE

(71) Applicant: Vanguard International Semiconductor Corporation, Hsinchu (TW)

(72) Inventors: Chi-Li Tu, Cyonglin Township (TW); Ching-Wen Wang, Hemei Township (TW); Karuna Nidhi, Patna (IN)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 17 days.

(21) Appl. No.: 14/849,091

(22) Filed: Sep. 9, 2015

(65) Prior Publication Data

US 2017/0069620 A1    Mar. 9, 2017

(51) Int. Cl.
*H01L 27/02*    (2006.01)
*H01L 27/06*    (2006.01)
(Continued)

(52) U.S. Cl.
CPC ...... *H01L 27/0255* (2013.01); *H01L 27/0248* (2013.01); *H01L 27/0259* (2013.01);
(Continued)

(58) Field of Classification Search
CPC . H01L 27/067; H01L 27/0676; H01L 29/861; H01L 29/866; H01L 29/872; H01L 29/0804; H01L 29/0808; H01L 29/0821; H01L 29/735; H01L 27/0255; H01L 27/0259; H01L 27/0262; H01L 29/1008; H01L 29/0642; H01L 29/0646; H01L 28/20; H01L 27/0207; H01L 29/0649; H01L 27/0274; H01L 27/0277; H01L 27/0248
See application file for complete search history.

(56) References Cited

U.S. PATENT DOCUMENTS 5,139,959 A * 8/1992 Craft ................. H01L 27/0248
148/DIG. 11
5,158,899 A * 10/1992 Yamagata .......... H01L 27/0251
257/355

(Continued)

FOREIGN PATENT DOCUMENTS

JP    2001177091 A    * 6/2001    ......... H01L 29/4236

*Primary Examiner* — Yu Chen
*Assistant Examiner* — Pauline Vu
(74) *Attorney, Agent, or Firm* — Birch, Stewart, Kolasch & Birch, LLP

(57) ABSTRACT

The invention provides a semiconductor device layout structure disposed in an active region. The semiconductor device layout structure includes a first well region having a first conduction type. A second well region having a second conduction type opposite the first conduction type is disposed adjacent to and enclosing the first well region. A first doped region having the second conduction type is disposed within the first well region. A second doped region having the second conduction type is disposed within the first well region. The second doped region is separated from and surrounds the first doped region. A third doped region having the second conduction type is disposed within the second well region.

22 Claims, 16 Drawing Sheets

(51) Int. Cl.
  *H01L 29/06* (2006.01)
  *H01L 29/08* (2006.01)
  *H01L 29/10* (2006.01)
  *H01L 29/735* (2006.01)
  *H01L 29/866* (2006.01)
  *H01L 29/872* (2006.01)
  *H01L 49/02* (2006.01)

(52) U.S. Cl.
  CPC ...... *H01L 27/0262* (2013.01); *H01L 27/0274* (2013.01); *H01L 27/0277* (2013.01); *H01L 27/067* (2013.01); *H01L 28/20* (2013.01); *H01L 29/0642* (2013.01); *H01L 29/0646* (2013.01); *H01L 29/0649* (2013.01); *H01L 29/0808* (2013.01); *H01L 29/0821* (2013.01); *H01L 29/1008* (2013.01); *H01L 29/735* (2013.01); *H01L 29/866* (2013.01); *H01L 29/872* (2013.01); *H01L 27/0207* (2013.01)

(56) References Cited

U.S. PATENT DOCUMENTS

| | | | | | |
|---|---|---|---|---|---|
| 5,536,665 | A * | 7/1996 | Komori | ............. | H01L 27/10805 148/DIG. 85 |
| 5,756,387 | A * | 5/1998 | Villa | ............. | H01L 29/866 257/469 |
| 6,175,478 | B1 * | 1/2001 | Chiozzi | ............. | H03F 1/523 361/101 |
| 6,268,639 | B1 * | 7/2001 | Li | ............. | H01L 27/0251 257/107 |
| 6,365,932 | B1 * | 4/2002 | Kouno | ............. | H01L 27/0255 257/133 |
| 6,399,990 | B1 * | 6/2002 | Brennan | ............. | H01L 27/0266 257/355 |
| 6,674,147 | B2 * | 1/2004 | Sakamoto | ............. | H01L 27/0761 257/560 |
| 6,707,109 | B2 * | 3/2004 | Hayashida | ............. | H01L 27/0255 257/173 |
| 7,053,452 | B2 * | 5/2006 | Sang | ............. | H01L 27/0266 257/355 |
| 7,394,133 | B1 * | 7/2008 | Vashchenko | ............. | H01L 27/0262 257/355 |
| 7,626,243 | B2 * | 12/2009 | Disney | ............. | H01L 27/0251 257/546 |
| 8,218,276 | B2 | 7/2012 | Mallikarjunaswamy | | |
| 8,503,141 | B2 | 8/2013 | Mallikarjunaswamy | | |
| 8,698,196 | B2 | 4/2014 | Guan et al. | | |
| 2003/0071310 | A1 * | 4/2003 | Sailing | ............. | H01L 27/0277 257/355 |
| 2004/0012066 | A1 * | 1/2004 | Dietl | ............. | H01L 29/872 257/471 |
| 2004/0016992 | A1 * | 1/2004 | Mallikarjunaswamy | ............. | H01L 27/0262 257/546 |
| 2004/0043568 | A1 * | 3/2004 | Ker | ............. | H01L 21/26586 438/279 |
| 2004/0155300 | A1 * | 8/2004 | Baird | ............. | H01L 27/0277 257/380 |
| 2004/0201071 | A1 * | 10/2004 | Dosluoglu | ............. | H01L 27/14647 257/431 |
| 2005/0073024 | A1 * | 4/2005 | Frey | ............. | H01L 23/5252 257/530 |
| 2005/0224882 | A1 * | 10/2005 | Chatty | ............. | H01L 29/1083 257/355 |
| 2005/0275027 | A1 * | 12/2005 | Mallikarjunaswamy | ............. | H01L 27/0266 257/355 |
| 2006/0208340 | A1 * | 9/2006 | Glenn | ............. | H01L 27/0255 257/603 |
| 2006/0232898 | A1 * | 10/2006 | Morishita | ............. | H01L 27/0262 361/56 |
| 2007/0096261 | A1 * | 5/2007 | Otake | ............. | H01L 29/66106 257/603 |
| 2008/0203424 | A1 * | 8/2008 | Chen | ............. | H01L 27/0255 257/102 |
| 2008/0218922 | A1 * | 9/2008 | Mallikararjunaswamy | ............. | H01L 27/0262 361/91.6 |
| 2008/0265359 | A1 * | 10/2008 | Noda | ............. | H01L 29/0619 257/495 |
| 2009/0294870 | A1 * | 12/2009 | Arai | ............. | H01L 21/823437 257/378 |
| 2010/0148265 | A1 * | 6/2010 | Lin | ............. | H01L 29/735 257/355 |
| 2010/0207163 | A1 * | 8/2010 | Yabu | ............. | H01L 27/0262 257/173 |
| 2010/0230745 | A1 * | 9/2010 | Saito | ............. | H01L 29/0619 257/329 |
| 2010/0276779 | A1 * | 11/2010 | Guan | ............. | H01L 27/0259 257/492 |
| 2011/0175199 | A1 * | 7/2011 | Lin | ............. | H01L 29/0646 257/605 |
| 2011/0248383 | A1 * | 10/2011 | Ren | ............. | H01L 27/0259 257/577 |
| 2012/0018837 | A1 * | 1/2012 | Anderson | ............. | H01L 29/66143 257/476 |
| 2012/0074515 | A1 * | 3/2012 | Chen | ............. | H01L 23/585 257/491 |
| 2012/0161298 | A1 * | 6/2012 | Ko | ............. | H01L 27/0255 257/656 |
| 2013/0020587 | A1 * | 1/2013 | Hino | ............. | H01L 29/1095 257/77 |
| 2013/0020680 | A1 * | 1/2013 | Chen | ............. | H01L 29/866 257/603 |
| 2013/0334665 | A1 * | 12/2013 | Sasaki | ............. | H01L 29/73 257/577 |
| 2014/0001473 | A1 * | 1/2014 | Chen | ............. | H01L 29/861 257/49 |
| 2014/0061715 | A1 * | 3/2014 | Chen | ............. | H01L 29/866 257/106 |
| 2014/0284720 | A1 * | 9/2014 | Chen | ............. | H01L 29/78 257/355 |
| 2014/0361333 | A1 * | 12/2014 | Kimura | ............. | H01L 29/7397 257/140 |
| 2015/0069424 | A1 * | 3/2015 | Willemen | ............. | H01L 31/173 257/84 |
| 2015/0115390 | A1 * | 4/2015 | Kim | ............. | H01L 27/0248 257/487 |

* cited by examiner

SEMICONDUCTOR DEVICE LAYOUT STRUCTURE

BACKGROUND OF THE INVENTION

Field of the Invention

The present invention relates to a semiconductor device layout structure, and in particular to a transient-voltage-suppression (TVS) diode layout structure.

Description of the Related Art

Transient-voltage-suppression (TVS) diodes are electronic components used to protect sensitive electronics from transient voltage spikes induced on connected wires. TVS diodes are usually connected in parallel with the circuit to be protected. Under normal operating conditions, a TVS diode acts as a high-impedance path to the protected circuit. When the transient voltage exceeds the circuit's normal operating voltage, the TVS diode rapidly becomes a low-impedance path for the transient current. Also, the operating circuit's voltage is clamped to a predetermined maximum clamping voltage. The TVS diode has a response time of about a few milliseconds, thereby protecting sensitive circuits from damage. The TVS diode returns to a high-impedance state after the transient current passes.

Thus, a novel TVS diode layout structure is desirable.

BRIEF SUMMARY OF THE INVENTION

A semiconductor device layout structure disposed in an active region of a semiconductor substrate is provided. An exemplary embodiment of a semiconductor device layout structure includes a first well region having a first conduction type. A second well region has a second conduction type opposite the first conduction type. The second well region is disposed adjacent to and enclosing the first well region. A first doped region having the second conduction type is disposed within the first well region. A second doped region having the second conduction type is disposed within the first well region. The second doped region is separated from and surrounds the first doped region. A third doped region having the second conduction type is disposed within the second well region.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
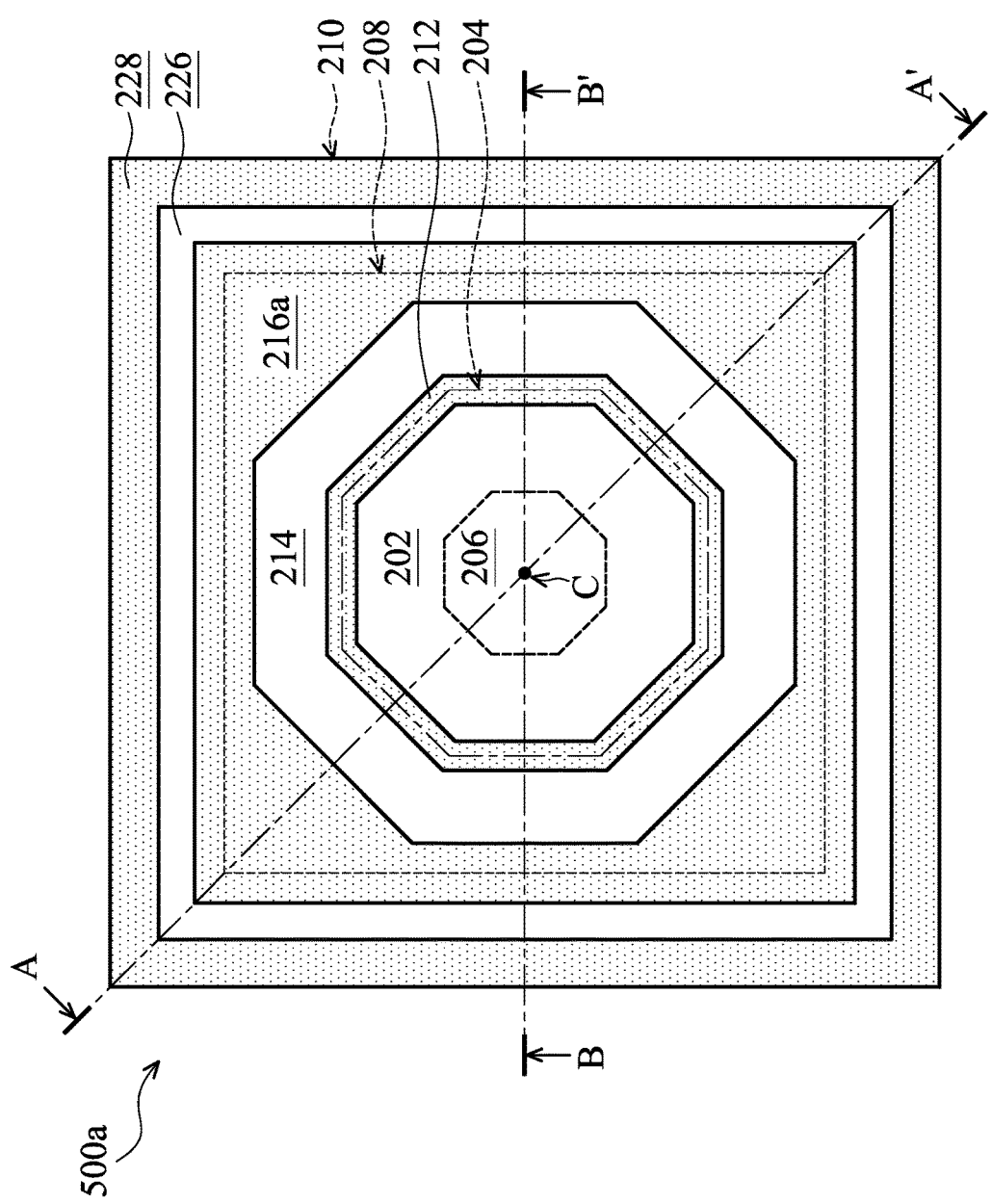
FIG. 1A is a plan view of a semiconductor device layout structure in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments provide a semiconductor device layout structure. The semiconductor device layout structure is a transient-voltage-suppression (TVS) diode. The TVS diode utilizes a design concept of a Zener diode coupled to a lateral bipolar junction transistor (lateral BJT) and a vertical bipolar junction transistor (vertical BJT), which are connected in parallel. The semiconductor device layout structure has improved current clamping performance.

Figure 1B:
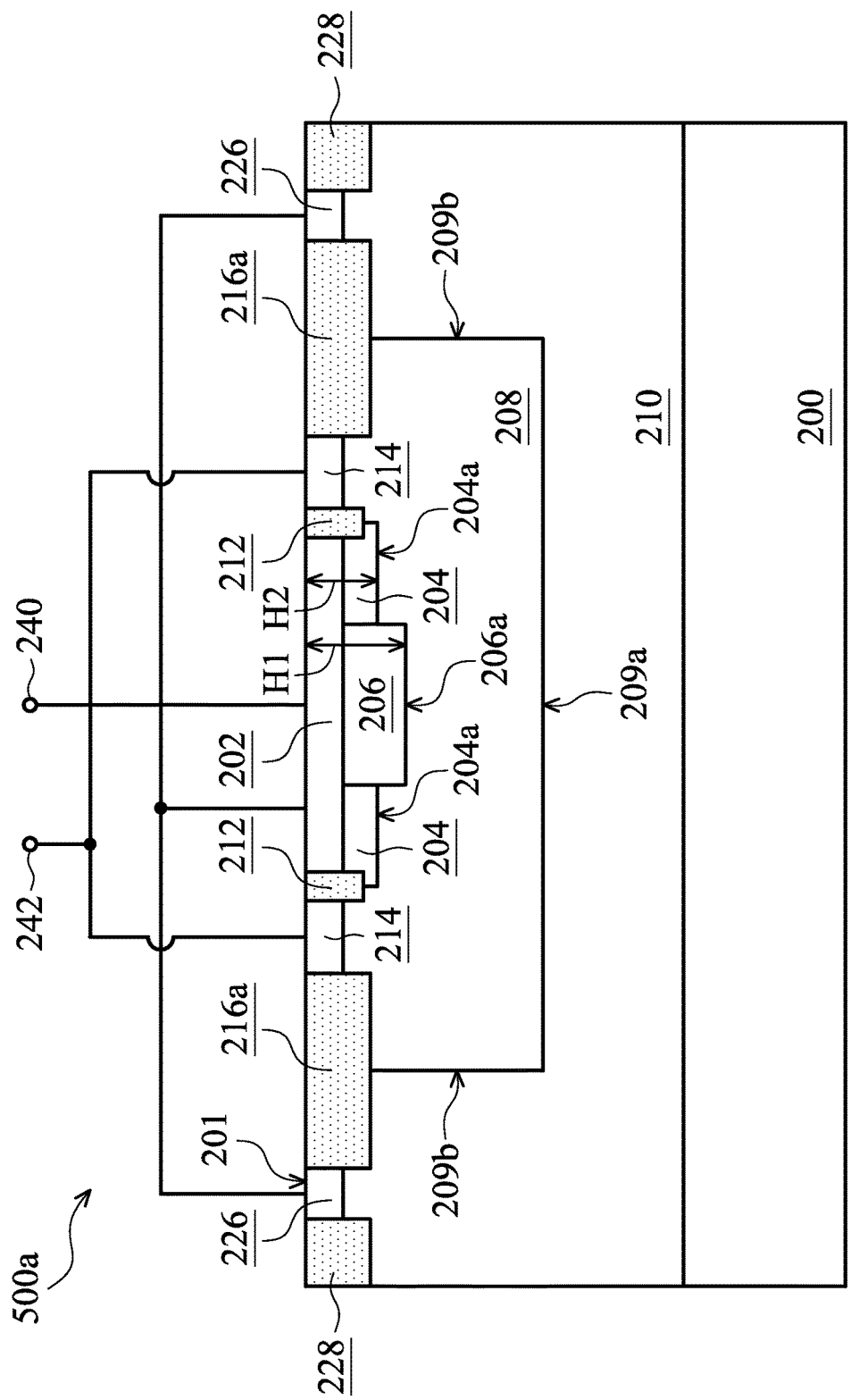
FIGS. 1B and 1C are cross-sectional views taken alone a line A-A' and a line B-B' of FIG. 1A, respectively.
Figure 1C:
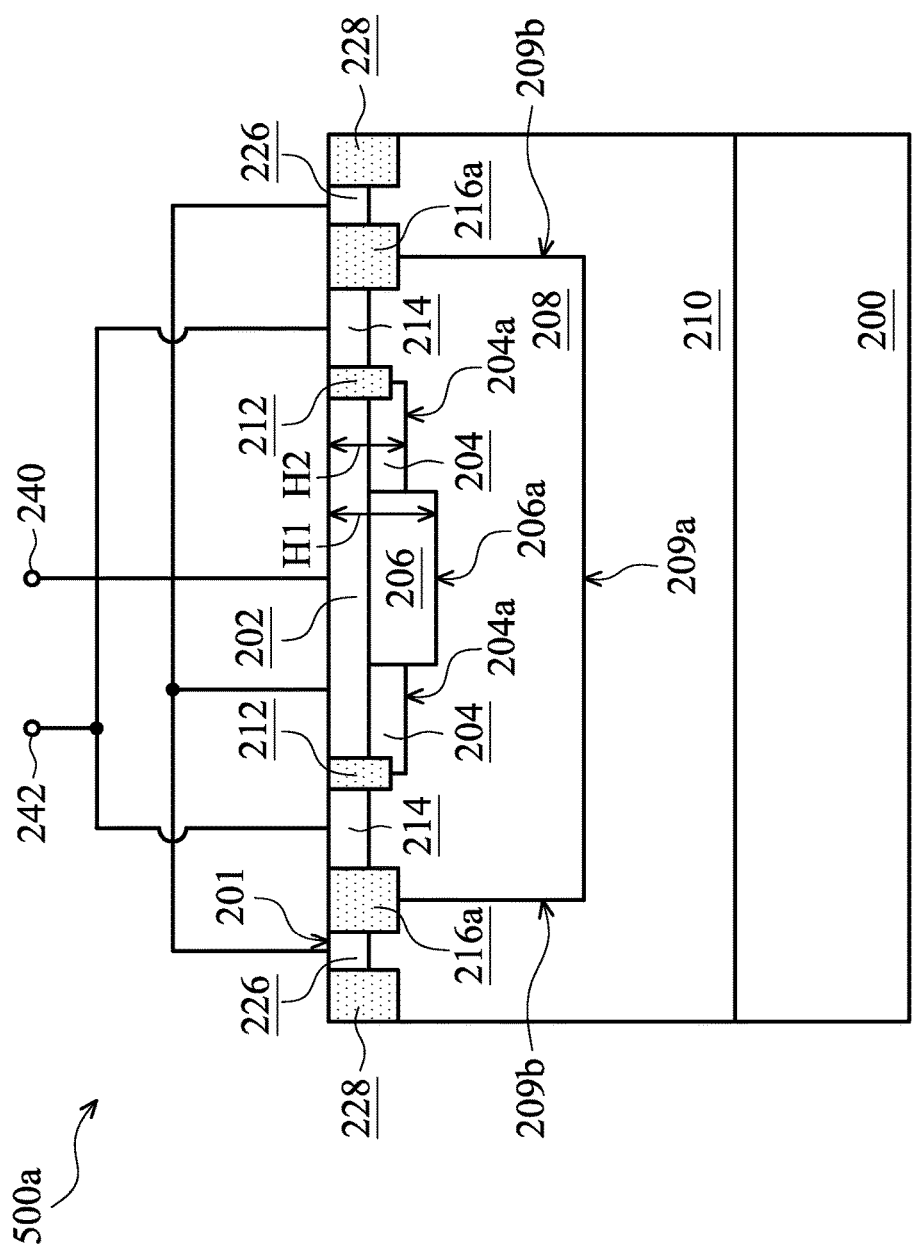
Figure 1D:
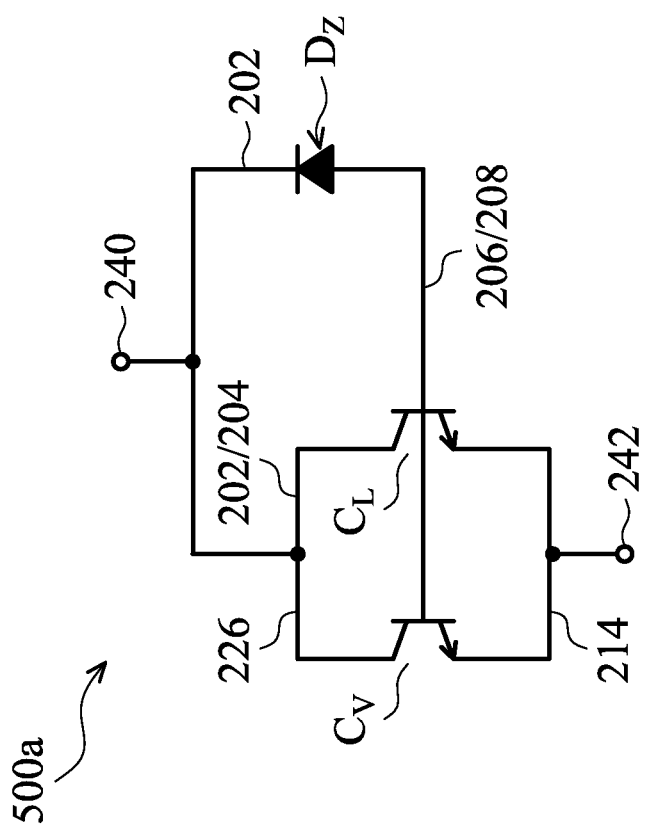
FIG. 1D is an equivalent circuit diagram shown in FIGS. 1A to 1C.

FIG. 1A is a plan view of a semiconductor device layout structure 500a in accordance with some embodiments of the disclosure. FIGS. 1B and 1C are cross-sectional views taken alone a line A-A' and a line B-B' of FIG. 1A, respectively. FIG. 1D is an equivalent circuit diagram of the semiconductor device layout structure 500a shown in FIGS. 1A to 1C. In some embodiments, the semiconductor device layout structure 500a may serve as a unit cell of the transient-voltage-suppression (TVS) diode. Therefore, a plurality of the semiconductor device layout structures 500a may be arranged periodically to form an array.

As shown in FIGS. 1A-1B, the semiconductor device layout structure 500a is positioned in a semiconductor substrate 200. The semiconductor substrate 200 has a first conduction type. For example, the semiconductor substrate 200 may be a p-type substrate. In some embodiments, the semiconductor device layout structure 500a includes one or more isolation features (for example, isolation features 212, 216a, 228 and etc.) formed on a surface 201 of the semiconductor substrate 200. Also, the isolation features are formed extended from the surface 201 of the semiconductor substrate 200 into a portion of the semiconductor substrate 200. In some embodiments, the isolation features 212, 216a and 228 may comprise local oxidation of silicon (LOCOS) features or shallow trench isolation (STI) features. The isolation feature 228 may be used to define an active region of the semiconductor device layout structure 500a. The semiconductor device layout structure 500a is positioned in the active region (surrounded by the isolation feature 228). The isolation features 212, 216a and 228 may be ring-shaped. The outer shape of the ring-shaped isolation features 212, 216a and 228 may comprise a circular-shape, a square, a polygonal-shape or other shapes. In some embodiments, the isolation features 212, 216a and 228 may have different outer shapes.

The semiconductor device layout structure 500a includes a first well region 208, a second well region 210, a first doped region 202, a second doped region 214 and a third doped region 226. The first well region 208 has a first conduction type. The second well region 210 has a second conduction type, which is opposite the first conduction type. Also, the second well region 210 adjacent to and enclosing the first well region 208. For example, the first well region 208 is a p-type well (PW) doped region, and the second well region 210 is an n-type well (NW) doped region. In some embodiments, the second well region 210 is constructed by a deep n-type well (DNW) doped region and an n-type well (NW) doped region. The DNW doped region is positioned directly under the first well region 208 and adjacent to a bottom boundary 209a of the first well region 208. Also, the NW doped region is positioned on the DNW doped region and connecting to the DNW doped region. The NW doped region is adjacent to and surrounding a side boundary 209b of the first well region 208.

As shown in FIGS. 1A-1C, the first doped region 202, the second doped region 214 and the third doped region 226 have the second conduction type. The first doped region 202 and the second doped region 214 are disposed in the first well region 208. The third doped region 226 is disposed in the second well region 210. The dopant concentration of the third doped region 226 is greater than that of second well region 210. The second doped region 214, which surrounds the first doped region 202, is separated from the first doped region 202 through the isolation feature 212. The isolation feature 216a is positioned at an interface between the first well region 208 and second well region 210 (i.e. the side boundary 209b of the first well region 208). The second doped region 214 and the third doped region 226 are positioned on opposite sides of the isolation feature 216a, respectively. The second doped region 214 is surrounded by the isolation features 216a and 212. Therefore, the third doped region 226, which surrounds the second doped region 214, is separated from the second doped region 214 through the isolation feature 216a. As shown in FIG. 1A, the first doped region 202, the second doped region 214, the third doped region 226, the first well region 208 and second well region 210 are concentrically disposed about the center point C. Accordingly, the isolation feature 212, which surrounds the first doped region 202, the isolation feature 216a, which surrounds the second doped region 214, and the isolation feature 228, which surrounds the third doped region 226 are concentrically disposed about the center point C. The first doped region 202 may be rectangular shape, polygonal shape, circular shape or round shape. In some embodiments as shown in FIG. 1A, the first doped region 202 is octagonal shape. The isolation feature 212 and the second doped region 214 are disposed corresponding to and surrounding the first doped region 202. Therefore, in some embodiments as shown in FIG. 1A, the isolation feature 212 and the second doped region 214 are octagonal-ring shape. The third doped region 226 is disposed close to the top surface 201 of the semiconductor substrate 200. Also, the second well region 210 is disposed close to the top surface 201 of the semiconductor substrate 200 and surrounding the boundary of the first well region 208. Therefore, in some embodiments as shown in FIG. 1A, when the first well region 208 is square shape, the portion of the second well region 210, which is close to the top surface 201 of the semiconductor substrate 200, is rectangular-ring shape.

In some embodiments, the first doped region 202, the second doped region 214 and the third doped region 226 are n-type heavily (N+) doped region. As shown in FIGS. 1B and 1C, the first doped region 202 and the third doped region 226 are collectively coupled to a node 240. The second doped region 214 is coupled to a node 242.

As shown in FIGS. 1A-1C, the semiconductor device layout structure 500a further includes a fourth doped region 206 and a fifth doped region 204 disposed in the first well region 208 and positioned directly under the first doped region 202. In other words, the fourth doped region 206 and the fifth doped region 204 are positioned between the first doped region 202 and the first well region 208. The fourth doped region 206 has the first conduction type. The fourth doped region 206 is positioned at a center position of the first doped region 202. The fifth doped region 204 having the second conduction type surrounds the fourth doped region 206. As shown in FIGS. 1B-1C, a bottom surface 206a of the fourth doped region 206 is separated from a top surface 201 of the semiconductor substrate 200 by a distance H1. A bottom surface 204a of the fifth doped region 204 is separated from the top surface 201 of the semiconductor substrate 200 by a distance H2. In some embodiments, the distance H1 is different from the distance H2. For example, the distance H1 is greater than the distance H2. In some embodiments, the conduction type of the fourth doped region 206 is the same as that of the first well region 208. The dopant concentration of the fourth doped region 206 is greater than that of the first well region 208. The conduction type of the fifth doped region 204 is the same as that of the first doped region 202. Also, the dopant concentration of the first doped region 202 is greater than that of the fifth doped region 204. For example, the fourth doped region 206 is a p-type lightly (P⁻) doped region, and the fifth doped region 204 an n-type lightly (N⁻) doped region. In some embodiments, the fourth doped region 206 can be used to adjust the breakdown voltage of a junction, which is composed of the first doped region 202 and the first well region 208.

As shown in FIG. 1D, the semiconductor device layout structure 500a is a TVS diode. The first doped region 202, the fourth doped region 206 and first well region 208 collectively form a Zener diode $D_z$. The first doped region 202 serves as a cathode of the Zener diode $D_z$, the fourth doped region 206 and the first well region 208 serve as an anode of the Zener diode $D_z$. Additionally, the first doped region 202, the fifth doped region 204, the first well region 208 and the second doped region 214 collectively form a first bipolar junction transistor $C_L$. The first doped region 202 and the fifth doped region 204 serve as a collector of the first bipolar junction transistor $C_L$. Also, the first well region 208 serves as a base of the first bipolar junction transistor $C_L$. The second doped region 214 serves as an emitter of the first bipolar junction transistor $C_L$. Further, the third doped region 226, the second well region 210, the first well region 208 and the second doped region 214 collectively form a second bipolar junction transistor $C_V$. The third doped region 226 and the second well region 210 serve as a collector of the second bipolar junction transistor $C_V$. The first well region 208 serves as a base of the second bipolar junction transistor $C_V$. The second doped region 214 serves as an emitter of the second bipolar junction transistor $C_V$. In some embodiments, when the first conduction type is p-type, and the second conduction type is n-type, the first bipolar junction transistor $C_L$ may serve as a NPN bipolar junction transistor, the second bipolar junction transistor $C_V$ may also serve as a NPN bipolar junction transistor. Additionally, the node 240 serves as a cathode of the TVS diode (the semiconductor device layout structure 500a), and the node 242 serves as an anode of the TVS diode (the semiconductor device layout structure 500a).

As shown in FIG. 1D, the first bipolar junction transistor $C_L$ and the second bipolar junction transistor $C_V$ are connected in parallel. The cathode (the first doped region 202) of the Zener diode $D_z$ is coupled to the collector (the first doped region 202 and the fifth doped region 204) of the first bipolar junction transistor $C_L$ and the collector (the third doped region 226 and the second well region 210) of the second bipolar junction transistor $C_V$. Also, the anode (the fourth doped region 206 and the first well region 208) of the Zener diode $D_z$ is coupled to the base (the first well region 208) of the first bipolar junction transistor and the base (the first well region 208) of the second bipolar junction transistor. In some embodiments, a current flowing from the emitter to the base of the first bipolar junction transistor $C_L$ is substantially parallel to the top surface 201 of the semiconductor substrate 200. Therefore, the first bipolar junction transistor $C_L$ is a lateral bipolar junction transistor. Also, a current flowing from the emitter to the base of the second bipolar junction transistor $C_V$ is substantially vertical to the top surface 201 of the semiconductor substrate 200. Therefore, the second bipolar junction transistor $C_V$ is a vertical bipolar junction transistor.

In some embodiments, the semiconductor device layout structure 500a utilizes the cathode and the anode of the of the Zener diode $D_z$ respectively coupled to the emitters of the first bipolar junction transistor $C_L$ and the second bipolar junction transistor $C_V$ and the bases of the first bipolar junction transistor $C_L$ and the second bipolar junction transistor $C_V$. Also, the first bipolar junction transistor $C_L$ and the second bipolar junction transistor $C_V$ are connected in parallel. When the node 240 is subjected to a high voltage, the breakdown of the Zener diode $D_z$ of the semiconductor device layout structure 500a occurs. The induced breakdown current flows from the first doped region 202 through the fourth doped region 206 and the first well region 208. Therefore, the breakdown current flows through the first well region 208 may trigger the first bipolar junction transistor $C_L$ and the second bipolar junction transistor $C_V$ from the bases (the first well region 208) of the first bipolar junction transistor $C_L$ and the second bipolar junction transistor $C_V$. Because the first bipolar junction transistor $C_L$ and the second bipolar junction transistor $C_V$ have the function of amplifying current, and because the first bipolar junction transistor $C_L$ and the second bipolar junction transistor $C_V$ are sensitive to the base current, the semiconductor device layout structure 500a can clamp the base current, which increases rapidly from the extreme low level to the high level. Also, the first bipolar junction transistor $C_L$ and the second bipolar junction transistor CV, which are connected in parallel, may improve the limit of the clamping current. Compared to a conventional TVS diode composed of a Zener diode, the semiconductor device layout structure 500a may improve the limit of the clamping current. Therefore, the current clamping performance of the semiconductor device layout structure 500a is improved.

Figure 2A:
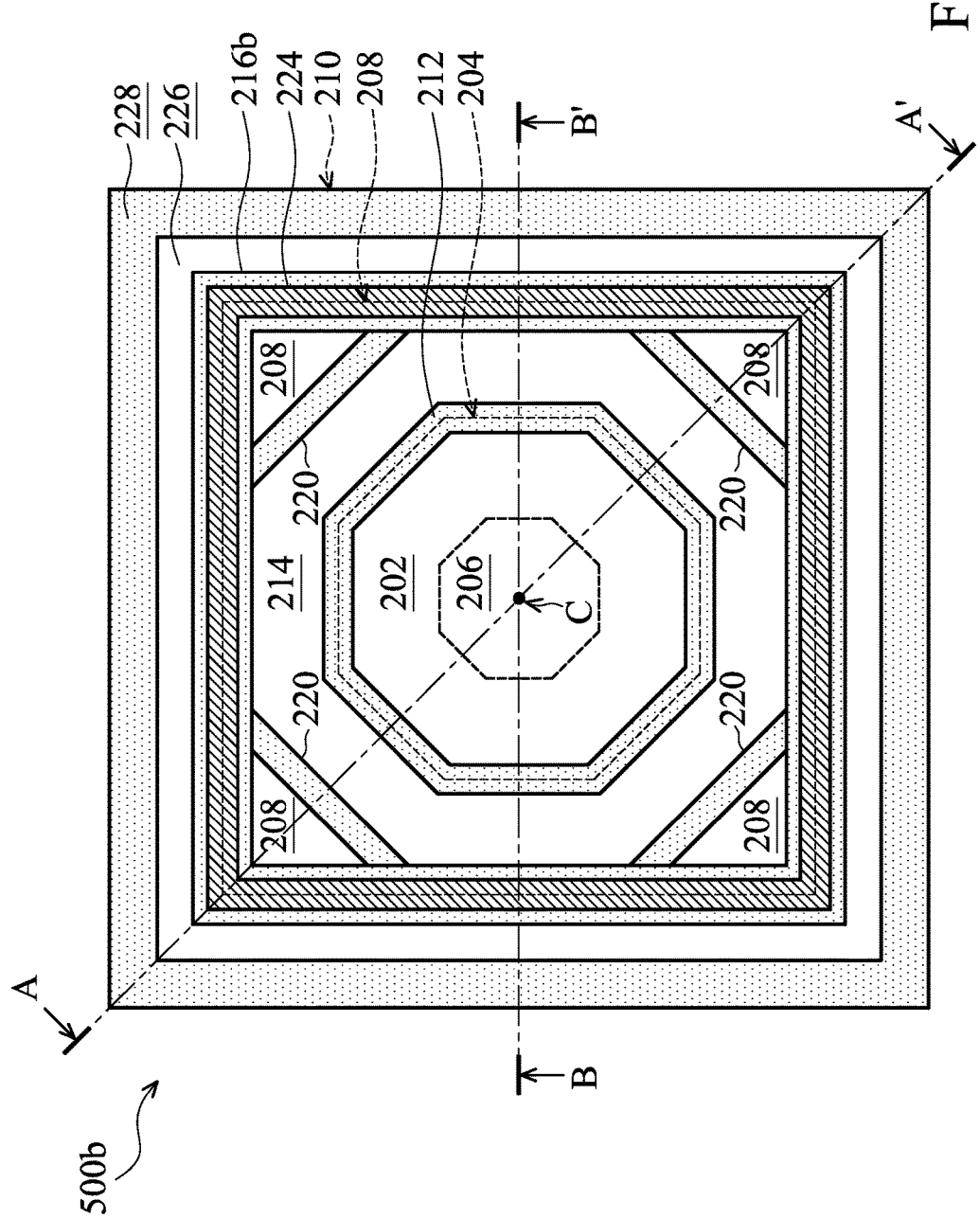
FIG. 2A is a plan view of a semiconductor device layout structure in accordance with some embodiments of the disclosure.
Figure 2B:
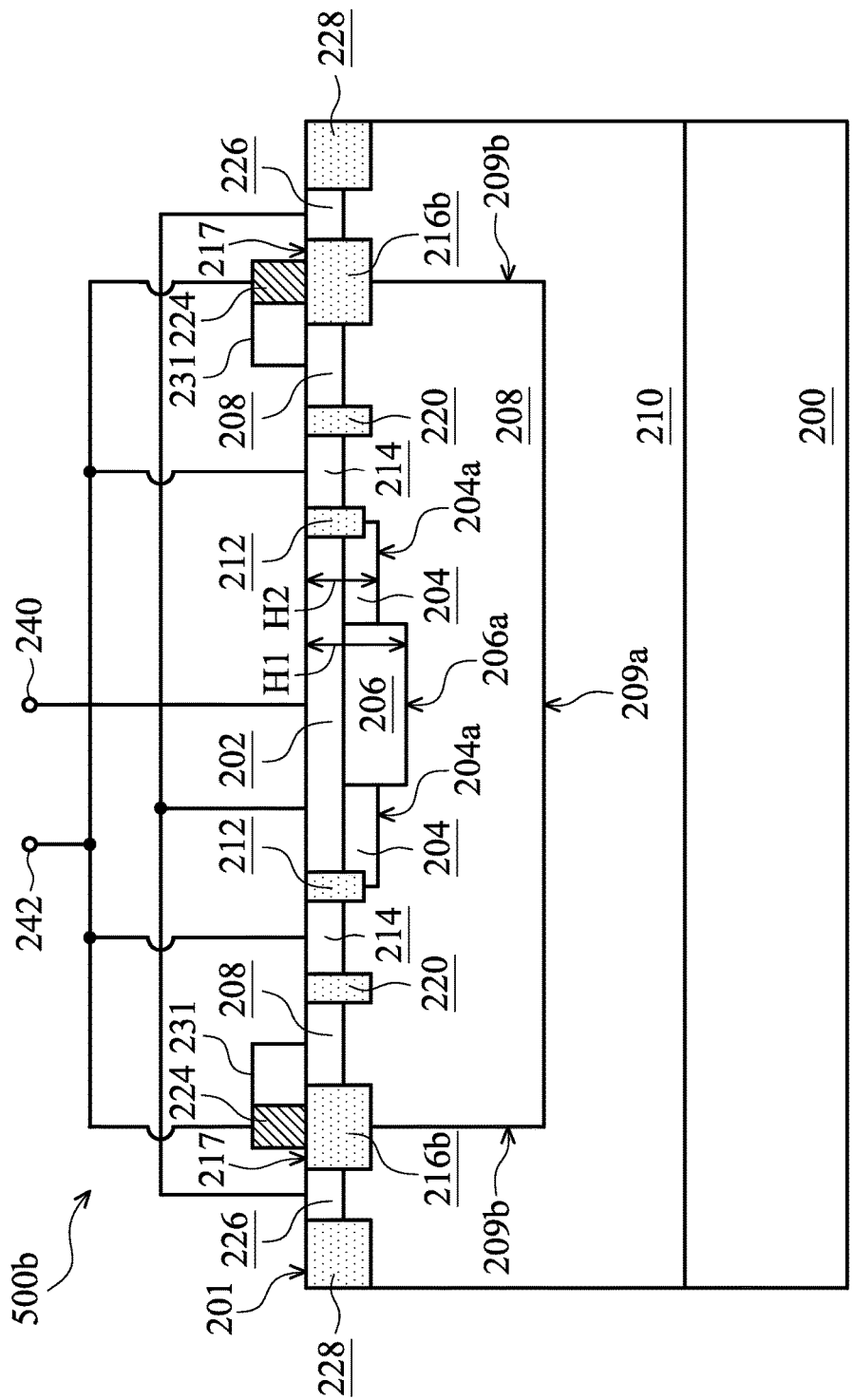
FIGS. 2B and 2C are cross-sectional views taken alone a line A-A' and a line B-B' of FIG. 2A, respectively.
Figure 2C:
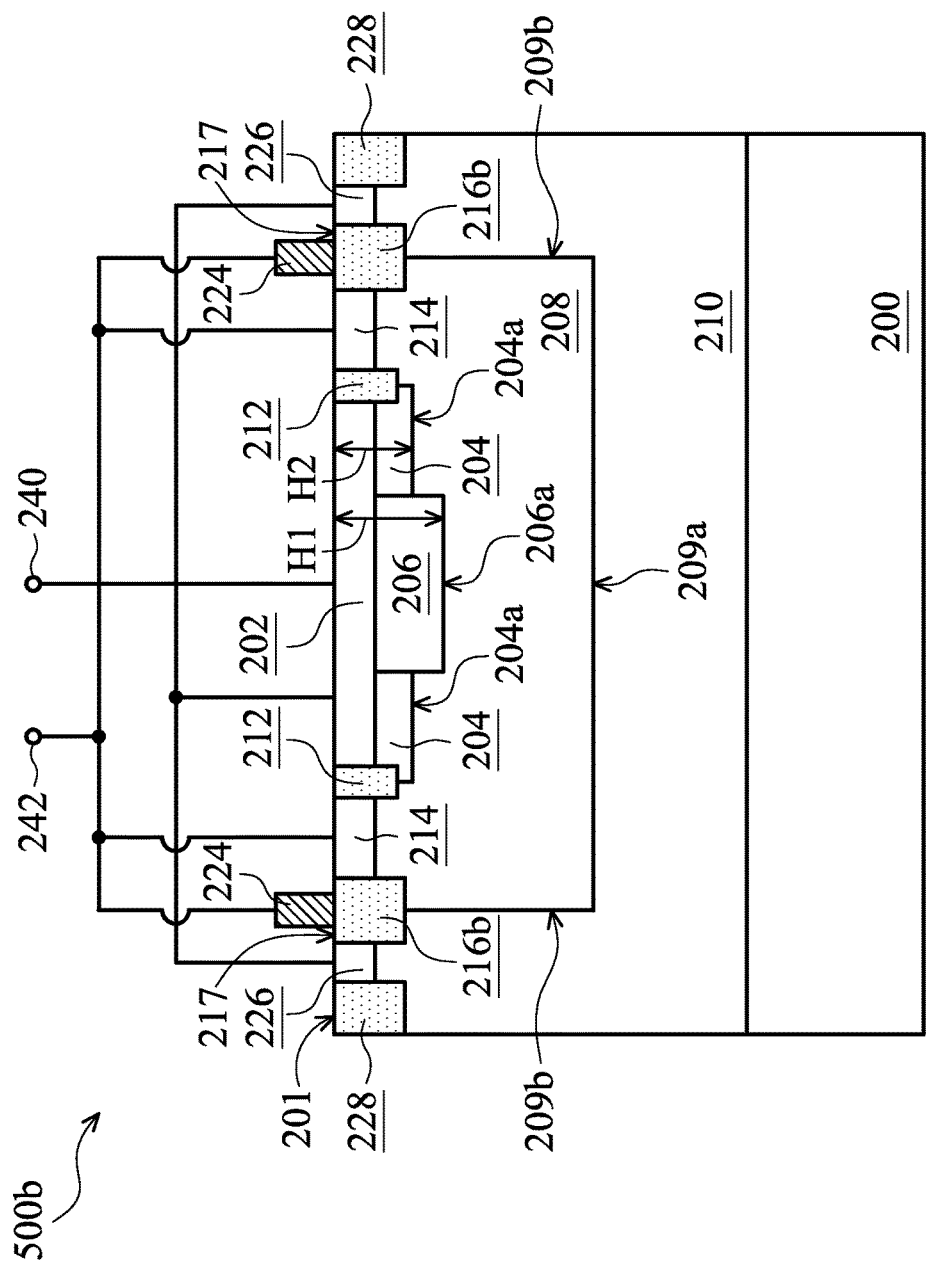

FIG. 2A is a plan view of a semiconductor device layout structure 500b in accordance with some embodiments of the disclosure. FIGS. 2B and 2C are cross-sectional views taken alone a line A-A' and a line B-B' of FIG. 2A, respectively.

Figure 2D:
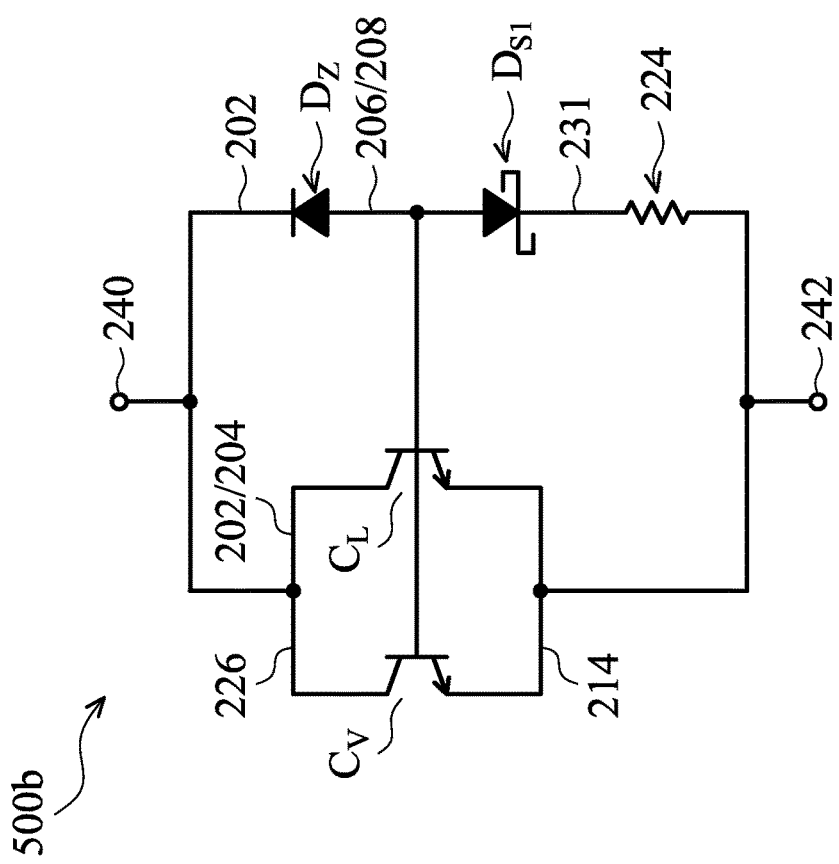
FIG. 2D is an equivalent circuit diagram shown in FIGS. 2A to 2C.

FIG. 2D is an equivalent circuit diagram of the semiconductor device layout structure 500b shown in FIGS. 2A to 2C. Descriptions of elements of the embodiments hereinafter that are the same or similar as those previously described with reference to FIGS. 1A-1C are omitted for brevity. In some embodiments, the semiconductor device layout structure 500b may serve as a unit cell of the transient-voltage-suppression (TVS) diode. Therefore, a plurality of the semiconductor device layout structures 500a may be arranged periodically to form an array. One of the differences between the semiconductor device layout structure 500b shown in FIGS. 2A to 2C and the semiconductor device layout structure 500a shown in FIGS. 1A to 1C is that the semiconductor device layout structure 500b further includes another isolation feature 220 and a polysilicon pattern 224.

As shown in FIGS. 2A to 2C, the isolation feature 220 is disposed on the semiconductor substrate 200 and in the first well region 208. In some embodiments as shown in FIG. 2A, two terminals of the isolation feature 220 respectively connect different portions of the sidewall of the isolation feature 216b, so that the second doped region 214 is surrounded by the isolation features 212, 216b and 220. The shape of the isolation feature 220 may be strip shape. Also, the isolation feature 220 may be positioned close to corners of the first well region 208. Because the two terminals of the isolation feature 220 respectively connect the different portions of the sidewall of the isolation feature 216b, portions of the first well region 208 are exposed portions of the top surface 201 of the semiconductor surface 200, which are surrounded by the isolation features 216b and 220. In some embodiments as shown in FIG. 2A, the exposed portions of the first well region 208 have a repeatable arrangement by rotating the exposed portions of the first well region 208 along an outer-paper direction of a normal line of the central point C of the first well region 208 with a rotating period of multiples of 90 degrees. In some other embodiments, the exposed portions of the first well region 208 have a repeatable arrangement by rotating the exposed portions of the first well region 208 along an outer-paper direction of a normal line of the central point C of the first well region 208 with a rotating period of multiples of 180 degrees. Similarly, in some embodiments as shown in FIG. 2A, the isolation feature 220 has a repeatable arrangement by rotating the isolation feature 220 along an outer-paper direction of a normal line of the central point C of the first well region 208 with a rotating period of multiples of 90 degrees. In some other embodiments, the isolation feature 220 has a repeatable arrangement by rotating the isolation feature 220 along an outer-paper direction of a normal line of the central point C of the first well region 208 with a rotating period of multiples of 180 degrees.

As shown in FIG. 2A, the exposed portions of the first well region 208 and the isolation feature 220 are positioned close to the corners of the first well region 208. Therefore, the exposed portions of the first well region 208 and the isolation feature 220 are illustrated in the cross-sectional view (FIG. 2B) taken along the line, which is along the diagonal line of the first well region 208 and passing through the center point C of the first well region 208 (i.e. the line A-A'). The exposed portions of the first well region 208 and the isolation feature 220 are not illustrated in the cross-sectional view (FIG. 2C) taken along the line, which connects the two adjacent corners of the first well region 208 and passing through the center point C of the first well region 208 (i.e. the line B-B').

As shown in FIGS. 2A to 2C, the polysilicon pattern 224 of the semiconductor device layout structure 500b is disposed on a top surface 217 of the isolation feature 216b and fully overlapping the isolation feature 216b. The polysilicon pattern 224 is coupled to the node 242 and the second doped region 214. Also, the polysilicon pattern 224 (corrected) is coupled to the first well region 208 through a conductive pattern 231, which is in direct contact with the first well region 208.

As shown in FIGS. 2B and 2D, the conductive pattern 231 and the first well region 208, which is in direct contact with the conductive pattern 231, of the semiconductor device layout structure 500b collectively form a Schottky diode $D_{S1}$. The first well region 208 serves as an anode of the Schottky diode $D_{S1}$. The conductive pattern 231 serves as a cathode of the Schottky diode $D_{S1}$. Additionally, the polysilicon pattern 224 of the semiconductor device layout structure 500b forms a resistor.

One of the differences between the equivalent circuit diagram of the semiconductor device layout structure 500b shown in FIG. 2D and the equivalent circuit diagram of the semiconductor device layout structure 500a shown in FIG. 1D is that the anode of the Schottky diode DS1 shown in the equivalent circuit diagram of the semiconductor device layout structure 500b is coupled to the anode of the Zener diode $D_z$, the base (the first well region 208) of the first bipolar junction transistor $C_L$ and the base (the first well region 208) of the second bipolar junction transistor $C_V$. The cathode of the Schottky diode $D_{S1}$ is coupled to the emitter (the second doped region 214) of the first bipolar junction transistor $C_L$ and the emitter (the second doped region 214) of the second bipolar junction transistor $C_V$ through the resistor (the polysilicon pattern 224). In some embodiments, when the first conduction type is p-type, and the second conduction type is n-type, the Schottky diode $D_{S1}$ may be a p-type Schottky diode.

In some embodiments, the semiconductor device layout structure 500b is a TVS diode. The semiconductor device layout structure 500b utilizes the cathode and the anode of the Zener diode $D_z$ respectively coupled to the emitters of the first bipolar junction transistor $C_L$ and the second bipolar junction transistor $C_V$ and the bases of the first bipolar junction transistor $C_L$ and the second bipolar junction transistor $C_V$. Also, the first bipolar junction transistor $C_L$ and the second bipolar junction transistor $C_V$ are connected in parallel. Further, the anode of the Zener diode $D_z$, the Schottky diode $D_{S1}$ and resistor (the polysilicon pattern 224) are connected in series. When the cathode (the node 240) of the TVS diode (the semiconductor device layout structure 500b) is subjected to a high voltage, the breakdown of the Zener diode $D_z$ of the semiconductor device layout structure 500b occurs. The induced breakdown current flows from the first doped region 202 through the fourth doped region 206 and the first well region 208. Then the induced breakdown current flows through the Schottky diode $D_{S1}$ and the resistor (the polysilicon pattern 224), which are connected in series, and back to the anode (the node 242) of the TVS diode (the semiconductor device layout structure 500b). The voltage drop of the Schottky diode $D_{S1}$ and the resistor (the polysilicon pattern 224), which are connected in series, can be increased due to the turn-on voltage of the Schottky diode $D_{S1}$. Therefore, the voltage drop between the emitters of the first bipolar junction transistor ($C_L$) and the second bipolar junction transistor ($C_V$) and the bases of the first bipolar junction transistor ($C_L$) and the second bipolar junction transistor ($C_V$) can be increased to trigger the first bipolar junction transistor $C_L$ and the second bipolar junction transistor $C_V$ from the bases (the first well region 208) of the first bipolar junction transistor CL and the second bipolar junction transistor CV. Because the first bipolar junction transistor CL and the second bipolar junction transistor CV have the function of amplifying current, the semiconductor device layout structure 500b can clamp the base current, which increases rapidly from the extreme low level to the high level. Also, the first bipolar junction transistor $C_L$ and the second bipolar junction transistor $C_V$, which are connected in parallel, may improve the limit of the clamping current. Compared to the conventional TVS diode composed of the Zener diode, the semiconductor device layout structure 500b may improve the limit of the clamping current. Therefore, the current clamping performance of the semiconductor device layout structure 500b is improved.

Figure 3A:
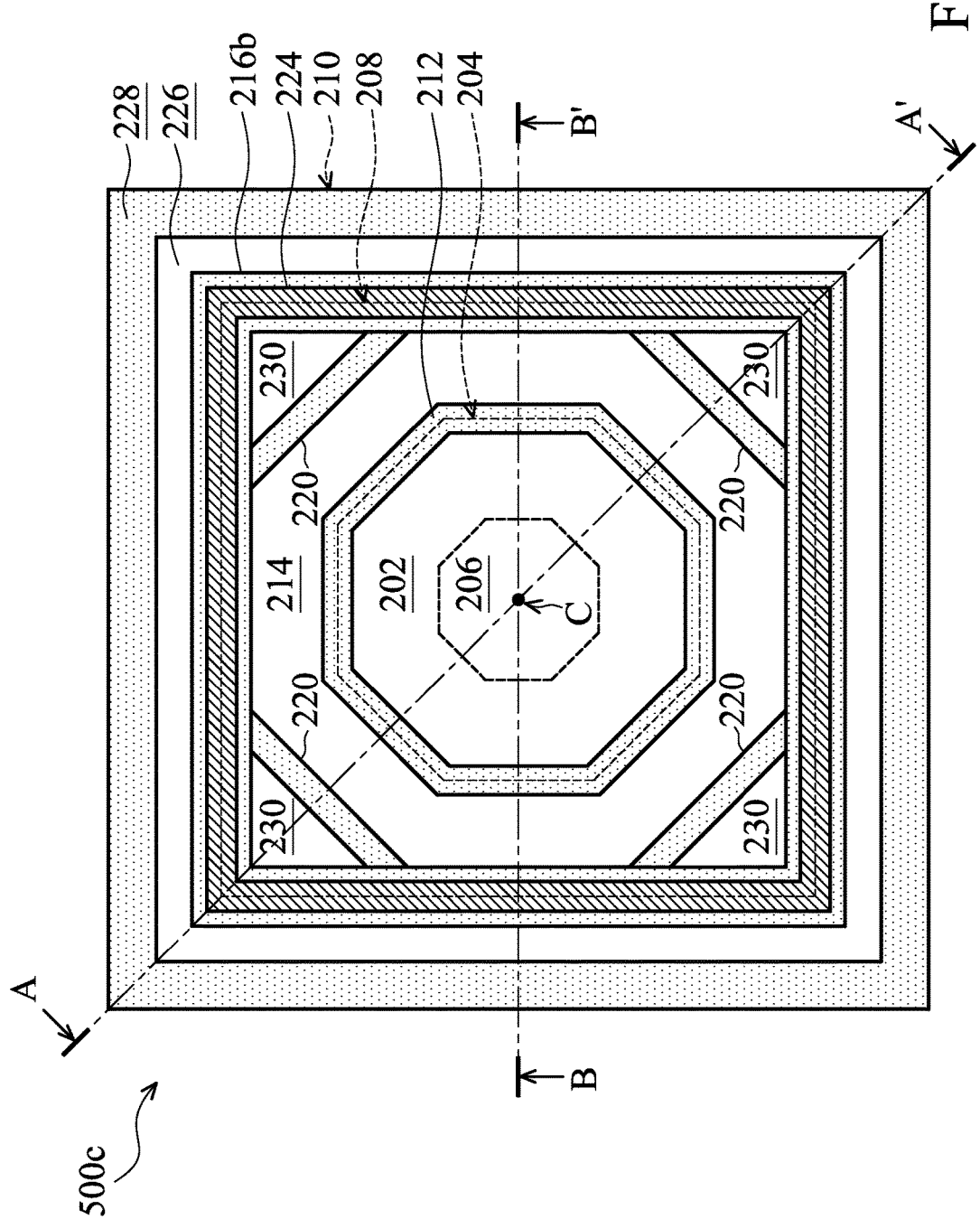
FIG. 3A is a plan view of a semiconductor device layout structure in accordance with some embodiments of the disclosure.
Figure 3B:
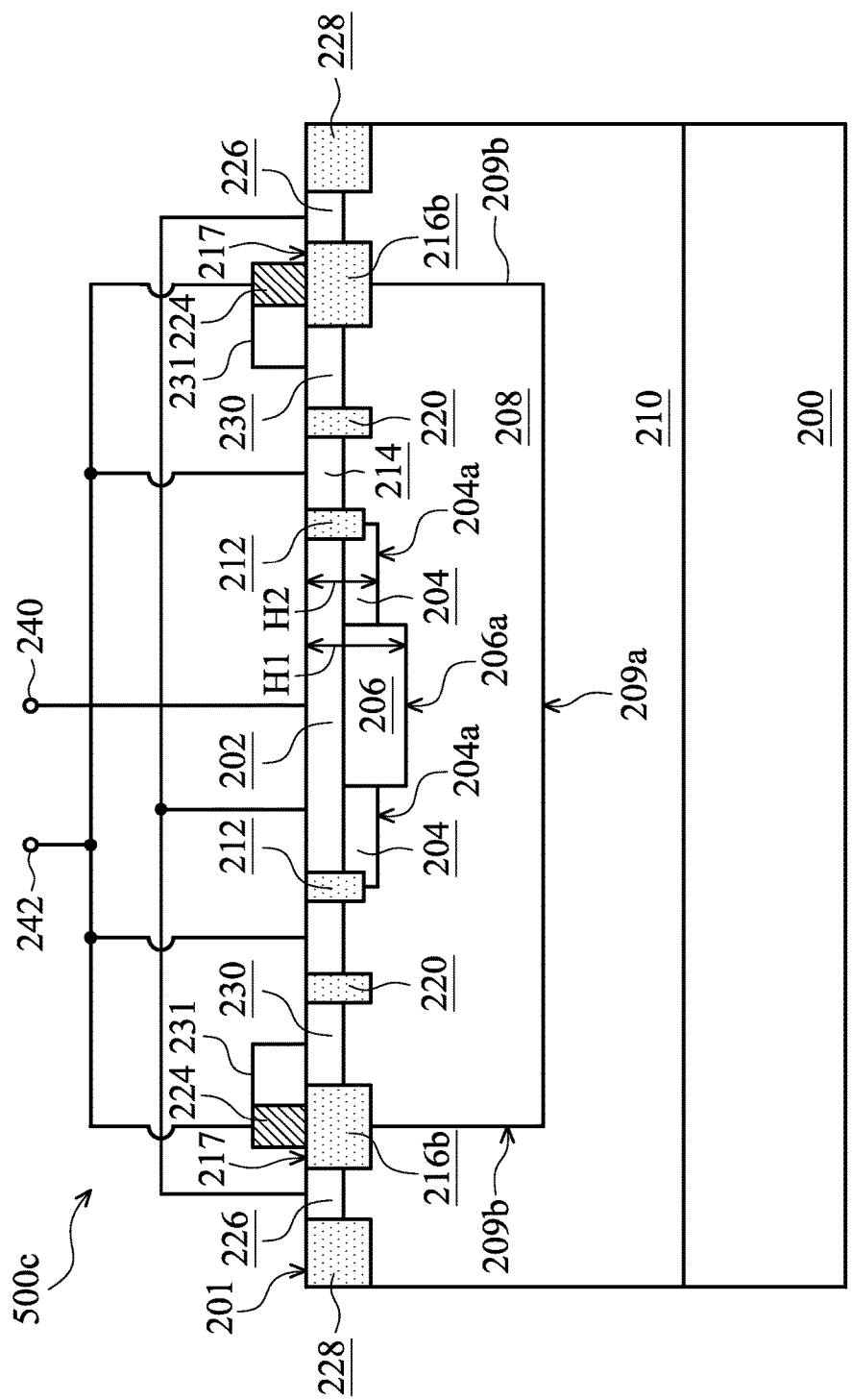
FIGS. 3B and 3C are cross-sectional views taken alone a line A-A' and a line B-B' of FIG. 3A, respectively.
Figure 3C:
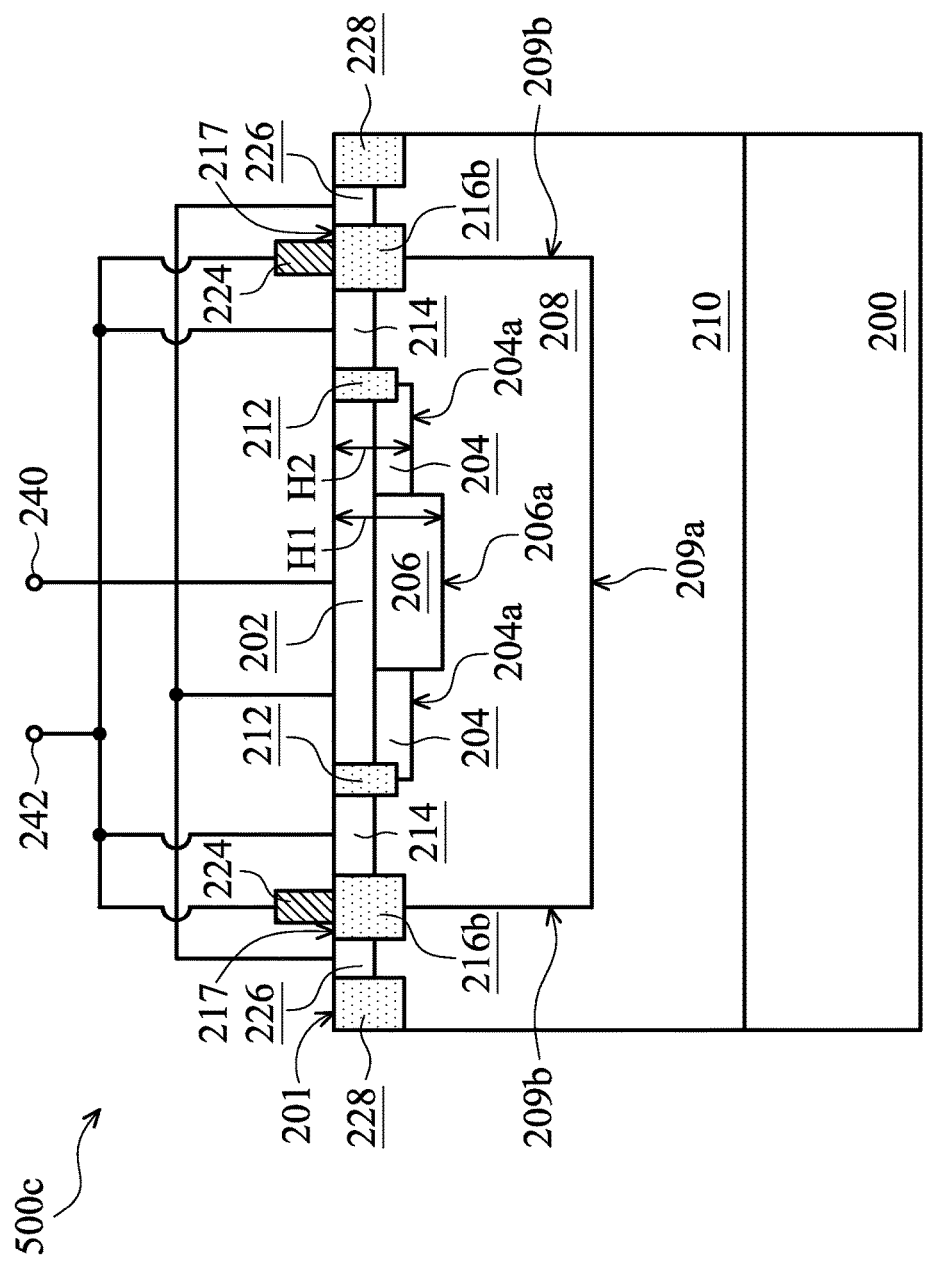
Figure 3D:
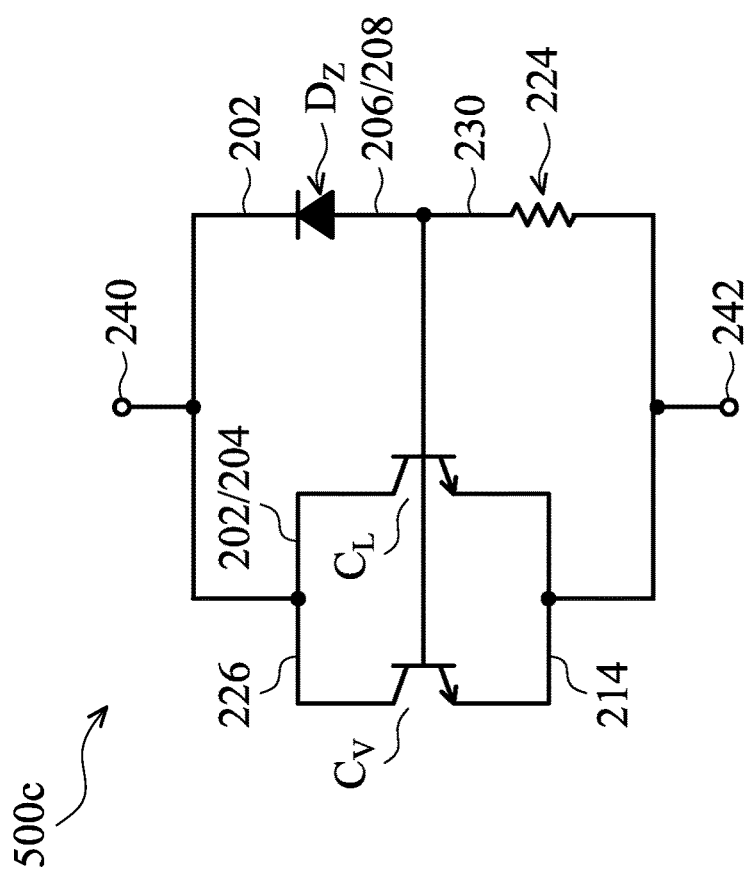
FIG. 3D is an equivalent circuit diagram shown in FIGS. 3A to 3C.

FIG. 3A is a plan view of a semiconductor device layout structure 500c in accordance with some embodiments of the disclosure. FIGS. 3B and 3C are cross-sectional views taken alone a line A-A' and a line B-B' of FIG. 3A, respectively. FIG. 3D is an equivalent circuit diagram of the semiconductor device layout structure 500c shown in FIGS. 3A to 3C. Descriptions of elements of the embodiments hereinafter that are the same or similar as those previously described with reference to FIGS. 1A-1C and 2A-2C are omitted for brevity. In some embodiments, the semiconductor device layout structure 500c may serve as a unit cell of the transient-voltage-suppression (TVS) diode. Therefore, a plurality of the semiconductor device layout structures 500c may be arranged periodically to form an array. One of the differences between the semiconductor device layout structure 500c shown in FIGS. 3A to 3C and the semiconductor device layout structure 500b shown in FIGS. 2A to 2C is that the semiconductor device layout structure 500c further includes a sixth doped region 230, which has the first conduction type, disposed in the first well region 208 and close to the corners of the first well region 208. Also, the sixth doped region 230 is close to a portion of the top surface 201 of the semiconductor surface 200, which are surrounded by the isolation features 216b and 220. The dopant concentration of the sixth doped region 230 is greater than that of the first well region 208. For example, the first well region 208 is a p-type well (PW) doped region, and the sixth doped region 230 is a p-type heavily ($P^+$) doped region. The sixth doped region 230 is coupled to the polysilicon pattern 224 through the conductive pattern 231. As shown in FIGS. 3A and 3B, the sixth doped region 230 and the third doped region 226 are disposed on opposite sides of the isolation feature 216b, respectively. The sixth doped region 230 and the second doped region 214 are disposed on opposite sides of the isolation feature 220, respectively. In some embodiments as shown in FIG. 3A, the sixth doped region 230 has a repeatable arrangement by rotating the sixth doped region 230 along an outer-paper direction of a normal line of the central point C of the first well region 208 with a rotating period of multiples of 90 degrees. In some other embodiments, the sixth doped region 230 has a repeatable arrangement by rotating the sixth doped region 230 along an outer-paper direction of a normal line of the central point C of the first well region 208 with a rotating period of multiples of 180 degrees.

As shown in FIG. 3A, the sixth doped region 230 is positioned close to the corners of the first well region 208. Therefore, the sixth doped region 230 is illustrated in the cross-sectional view (FIG. 3B) taken along the line (i.e. the line A-A'), which is along the diagonal line of the first well region 208 and passing through the center point C of the first well region 208, but not illustrated in the cross-sectional view (FIG. 3C) taken along the line (i.e. the line B-B'), which connects the two adjacent corners of the first well region 208 and passing through the center point C of the first well region 208.

As shown in FIGS. 3B and 3D, the polysilicon pattern 224 forms a resistor. The polysilicon pattern 224 is coupled to the node 242 and the second doped region 214. Also, the polysilicon pattern 224 is coupled to the first well region 208 through a conductive pattern 231.

One of the differences between the equivalent circuit diagram of the semiconductor device layout structure 500c shown in FIG. 3D and the equivalent circuit diagram of the semiconductor device layout structure 500b shown in FIG. 2D is that a terminal of the resistor (the polysilicon pattern 224) is coupled to the anode (the fourth doped region 206 and the first well region 208) of the Zener diode $D_z$, the base (the first well region 208) of the first bipolar junction transistor $C_L$ and the base (the first well region 208) of the second bipolar junction transistor $C_V$ through the sixth doped region 230. Another terminal of the resistor (the polysilicon pattern 224) is coupled to the emitter (the second doped region 214) of the first bipolar junction transistor $C_L$ and the emitter (the second doped region 214) of the second bipolar junction transistor $C_V$.

In some embodiments, the semiconductor device layout structure 500c is a TVS diode. The semiconductor device layout structure 500c utilizes the cathode and the anode of the of the Zener diode $D_z$ respectively coupled to the emitters of the first bipolar junction transistor $C_L$ and the second bipolar junction transistor $C_V$ and the bases of the first bipolar junction transistor $C_L$ and the second bipolar junction transistor $C_V$. Also, the first bipolar junction transistor $C_L$ and the second bipolar junction transistor $C_V$ are connected in parallel. Further, the anode of the Zener diode $D_z$ is series connected a resistor (the polysilicon pattern 224). Additionally, the sixth doped regions 230, which serves as a pick-up doped region of the bases of the first bipolar junction transistor $C_L$ and the second bipolar junction transistor $C_V$, is designed positioned at the corners of the first well region 208 and having the minimum area (size) according to the design rule. Therefore, the resistance of the bases of the first bipolar junction transistor $C_L$ and the second bipolar junction transistor $C_V$ can be increased. The increased resistance of the bases of the first bipolar junction transistor $C_L$ and the second bipolar junction transistor $C_V$ can early trigger the first bipolar junction transistor $C_L$ and the second bipolar junction transistor $C_V$. When the cathode (the node 240) of the TVS diode (the semiconductor device layout structure 500c) is subjected to a high voltage, the breakdown of the Zener diode $D_z$ of the semiconductor device layout structure 500c occurs. The induced breakdown current flows from the first doped region 202 through the fourth doped region 206 and the first well region 208. Then the induced breakdown current flows through the sixth doped region 230, which is positioned at the corner of the first well region 208, and the resistor (the polysilicon pattern 224), and back to the anode (the node 242) of the TVS diode (the semiconductor device layout structure 500c). The voltage drop between the emitters of the first bipolar junction transistor ($C_L$) and the second bipolar junction transistor ($C_V$) and the bases of the first bipolar junction transistor ($C_L$) and the second bipolar junction transistor ($C_V$) can trigger the first bipolar junction transistor $C_L$ and the second bipolar junction transistor $C_V$. Because the first bipolar junction transistor $C_L$ and the second bipolar junction transistor CV have the function of amplifying current, the semiconductor device layout structure 500c can clamp the base current, which increases rapidly from the extreme low level to the high level. Also, the first bipolar junction transistor $C_L$ and the second bipolar junction transistor $C_V$, which are connected in parallel, may improve the limit of the clamping current. Compared to the conventional TVS diode composed of the Zener diode, the semiconductor device layout structure 500c may improve the limit of the clamping current. Therefore, the current clamping performance of the semiconductor device layout structure 500c is improved.

Figure 4A:
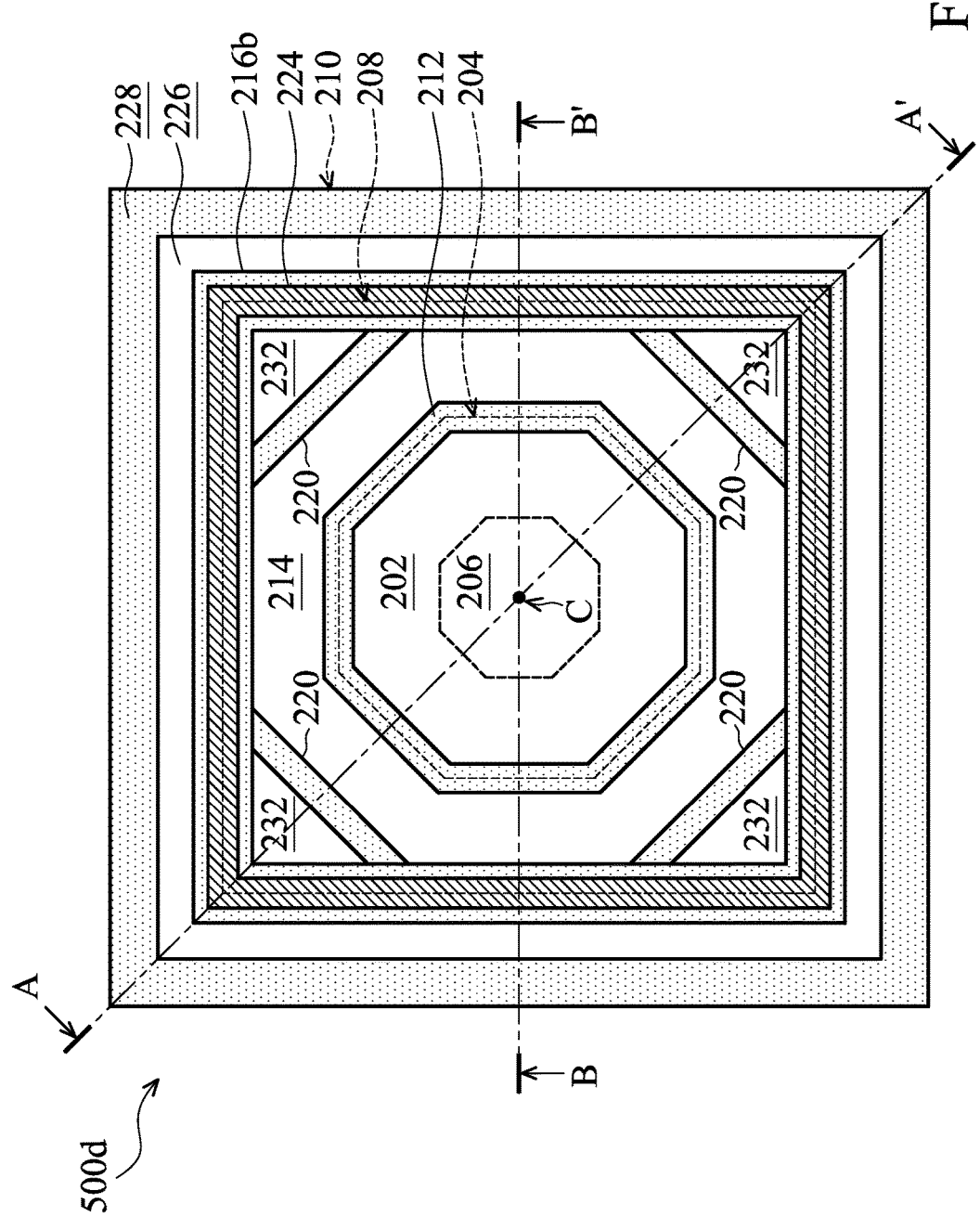
FIG. 4A is a plan view of a semiconductor device layout structure in accordance with some embodiments of the disclosure.
Figure 4B:
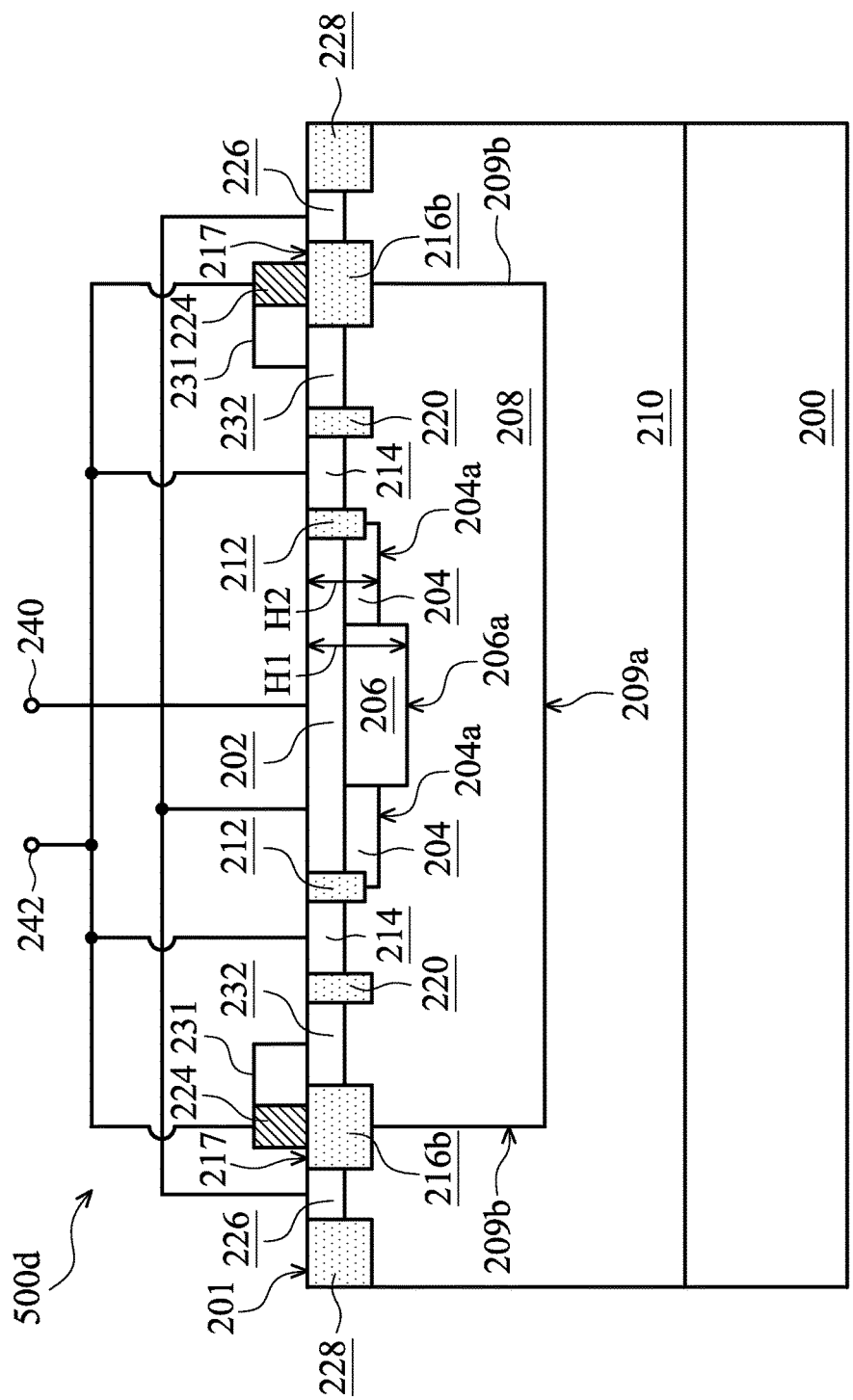
FIGS. 4B and 4C are cross-sectional views taken alone a line A-A' and a line B-B' of FIG. 4A, respectively.
Figure 4C:
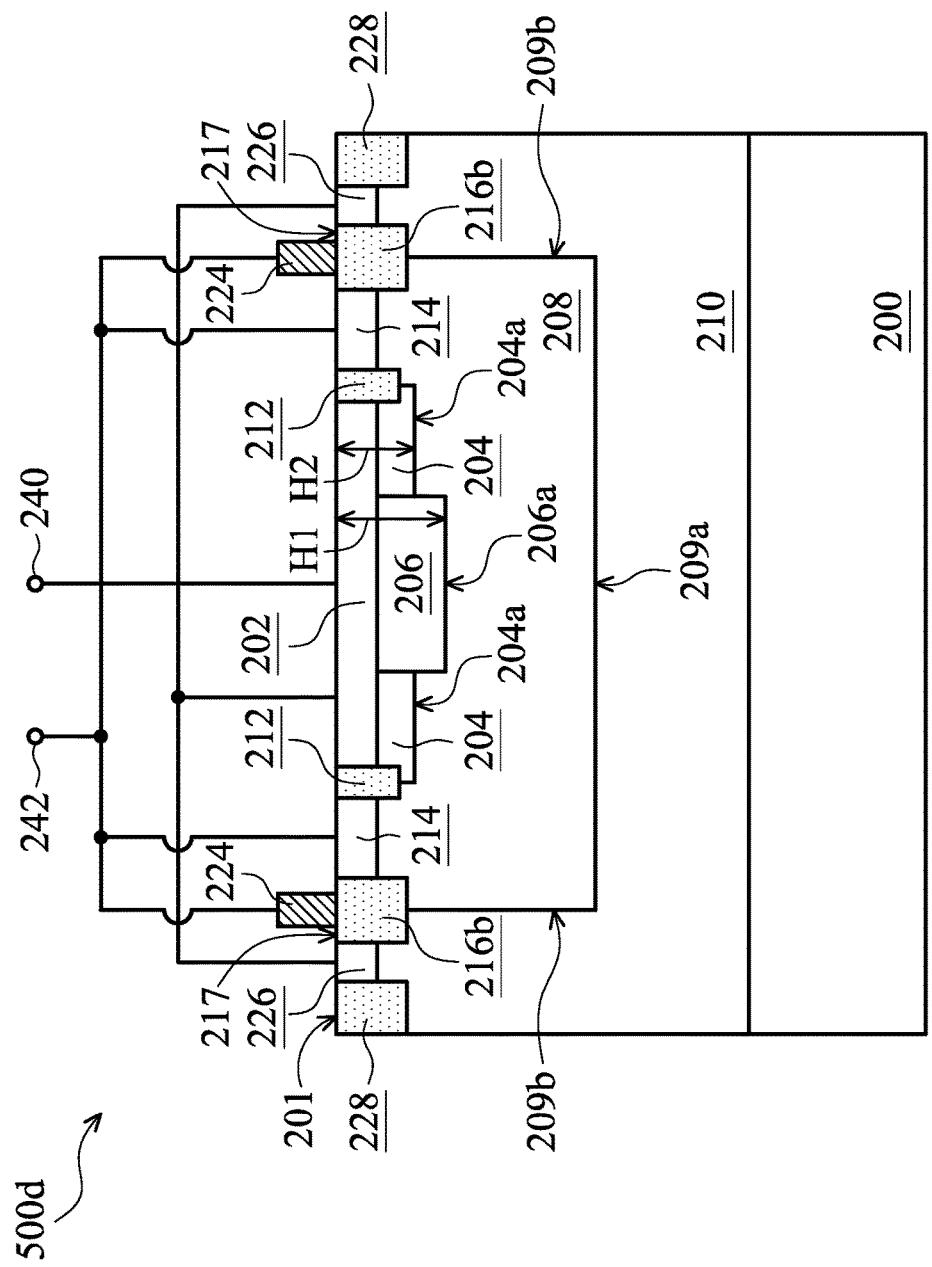
Figure 4D:
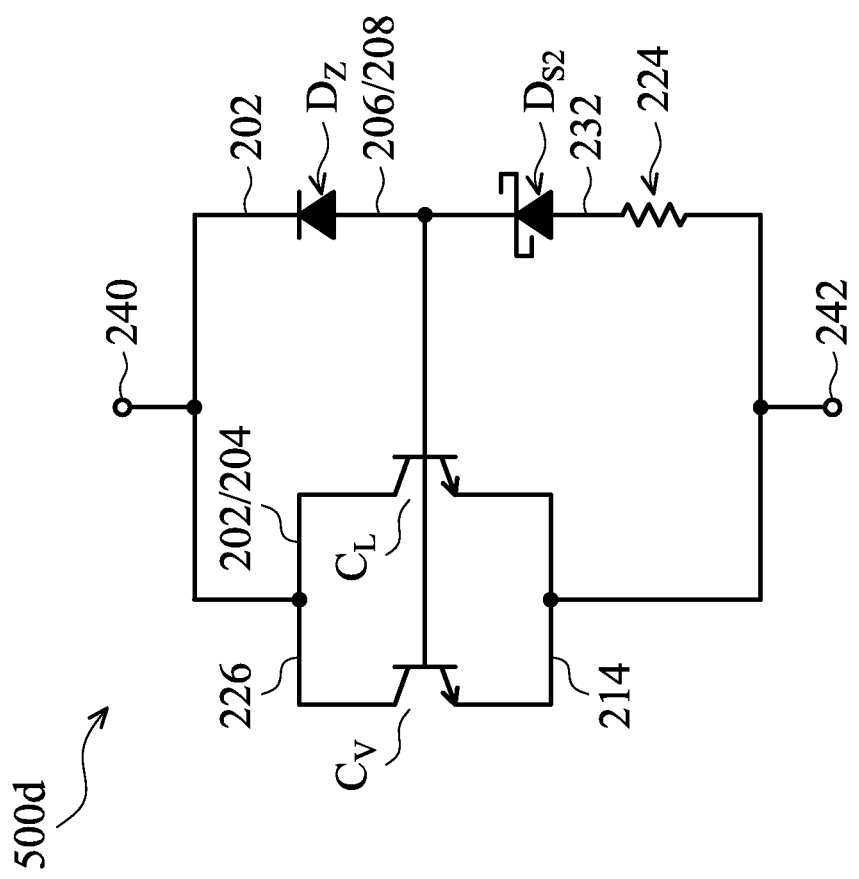
FIG. 4D is an equivalent circuit diagram shown in FIGS. 4A to 4C.

FIG. 4A is a plan view of a semiconductor device layout structure 500d in accordance with some embodiments of the disclosure. FIGS. 4B and 4C are cross-sectional views taken alone a line A-A' and a line B-B' of FIG. 4A, respectively. FIG. 4D is an equivalent circuit diagram of the semiconductor device layout structure 500d_shown in FIGS. 4A to 4C. Descriptions of elements of the embodiments hereinafter that are the same or similar as those previously described with reference to FIGS. 1A-1C, 2A-2C and 3A-3C are omitted for brevity. In some embodiments, the semiconductor device layout structure 500d may serve as a unit cell of the transient-voltage-suppression (TVS) diode. Therefore, a plurality of the semiconductor device layout structures 500d may be arranged periodically to form an array. One of the differences between the semiconductor device layout structure 500d and the semiconductor device layout structure 500b (FIGS. 2A to 2C) is that the semiconductor device layout structure 500d further includes a sixth doped region 232, which has the second conduction type, disposed in the first well region 208 and close to the corners of the first well region 208. Also, the sixth doped region 232 is close to a portion of the top surface 201 of the semiconductor surface 200, which are surrounded by the isolation features 216b and 220. The dopant concentration of the sixth doped region 232 is greater than that of the second well region 210. The dopant concentration of the sixth doped region 232 is less than those of the first doped region 202, the second doped region 214 and the third doped region 226. For example, the second well region 210 is an n-type well (NW) doped region, the first doped region 202, the second doped region 214 and the third doped region 226 are n-type heavily ($N^+$) doped regions. Also, the sixth doped region 232 is an n-type lightly ($N^-$) doped region. The sixth doped region 232 is coupled to the polysilicon pattern 224 and the node 242 through the conductive pattern 231. As shown in FIGS. 4A and 4B, the sixth doped region 232 and the third doped region 226 are disposed on opposite sides of the isolation feature 216b, respectively. The sixth doped region 232 and the second doped region 214 are disposed on opposite sides of the isolation feature 220, respectively. In some embodiments as shown in FIG. 4A, the sixth doped region 232 has a repeatable arrangement by rotating the sub-slit region along an outer-paper direction of a normal line of the central point C of the first well region 208 with a rotating period of multiples of 90 degrees. In some other embodiments, the sixth doped region 232 has a repeatable arrangement by rotating the sixth doped region 232 along an outer-paper direction of a normal line of the central point C of the first well region 208 with a rotating period of multiples of 180 degrees.

As shown in FIG. 4A, the sixth doped region 232 is positioned close to the corners of the first well region 208. Therefore, the sixth doped region 232 is illustrated in the cross-sectional view (FIG. 4B) taken along the line (i.e. the line A-A'), which is along the diagonal line of the first well region 208 and passing through the center point C of the first well region 208, but not illustrated in the cross-sectional view (FIG. 4C) taken along the line (i.e. the line B-B'), which connects the two adjacent corners of the first well region 208 and passing through the center point C of the first well region 208.

As shown in FIGS. 4B and 4D, the polysilicon pattern 224 of the semiconductor device layout structure 500b is disposed on a top surface 217 of the isolation feature 216b and fully overlapping the isolation feature 216b. The polysilicon pattern 224 is coupled to the node 242 and the second doped region 214. Also, polysilicon pattern 224 (corrected) is coupled to the sixth doped region 232 through the conductive pattern 231, which is in direct contact with the first well region 208.

As shown in FIGS. 4B and 4D, the conductive pattern 231 and the sixth doped region 232, which is in direct contact with the conductive pattern 231, of the semiconductor device layout structure 500d collectively form a Schottky diode $D_{S2}$. The conductive pattern 231 serves as an anode of the Schottky diode $D_{S2}$. The sixth doped region 232 serves as a cathode of the Schottky diode $D_{S2}$. Additionally, the polysilicon pattern 224 forms a resistor.

One of the differences between the equivalent circuit diagram of the semiconductor device layout structure 500d shown in FIG. 4D and the equivalent circuit diagram of the semiconductor device layout structure 500b shown in FIG. 2D is that the cathode of the Schottky diode $D_{S2}$ (shown in the equivalent circuit diagram of the semiconductor device layout structure 500d) is coupled to the anode of the Zener diode $D_z$, the base (the first well region 208) of the first bipolar junction transistor $C_L$ and the base (the first well region 208) of the second bipolar junction transistor $C_V$. The junction of the Schottky diode DS2 (formed by the sixth doped region 232 having the second conduction type and the first well region 208 having the first conduction type) is positioned in the bases of the first bipolar junction transistor CL and the second bipolar junction transistor CV. The anode of the Schottky diode $D_{S2}$ is coupled to the emitter (the second doped region 214) of the first bipolar junction transistor $C_L$ and the emitter (the second doped region 214) of the second bipolar junction transistor $C_V$ through the resistor (the polysilicon pattern 224). In some embodiments, when the first conduction type is p-type, and the second conduction type is n-type, the Schottky diode $D_{S2}$ may be an n-type Schottky diode.

In some embodiments, the semiconductor device layout structure 500d is a TVS diode. The semiconductor device layout structure 500d utilizes the cathode and the anode of the of the Zener diode $D_z$ respectively coupled to the emitters of the first bipolar junction transistor $C_L$ and the second bipolar junction transistor $C_V$ and the bases of the first bipolar junction transistor $C_L$ and the second bipolar junction transistor $C_V$. Also, the anode of the of the Zener diode $D_z$ and the resistor (the polysilicon pattern 224) are connected in series. Further, the junction of the n-type Schottky diode DS2 is positioned in the bases of the first bipolar junction transistor CL and the second bipolar junction transistor CV. When the cathode (the node 240) of the TVS diode (the semiconductor device layout structure 500d) is subjected to a high voltage, the breakdown of the Zener diode Dz of the semiconductor device layout structure 500d occurs. The induced breakdown current flows from the first doped region 202 through the fourth doped region 206 and the first well region 208. Then the induced breakdown current flows through the Schottky diode $D_{S2}$ and the resistor (the polysilicon pattern 224), which are connected in series, and back to the anode (the node 242) of the TVS diode (the semiconductor device layout structure 500d). When the voltage applied to the Zener diode $D_z$ (the induced breakdown current of the Zener diode $D_z$) is increased, the Schottky diode $D_{S2}$ is operated with the reverse bias and the reverse leakage current occurs. The reverse leakage current of the Schottky diode $D_{S2}$ limit the value of the current flowing through the resistor (the polysilicon pattern 224). Therefore, the induced breakdown current of the Zener diode $D_z$ is forced to flow through the bases of the first bipolar junction transistor $C_L$ and the second bipolar junction transistor $C_V$. Because the first bipolar junction transistor $C_L$ and the second bipolar junction transistor CV have the function of amplifying current, the semiconductor device layout structure 500d can clamp the base current, which increases rapidly from the extremely low level to the high level. Also, the first bipolar junction transistor $C_L$ and the second bipolar junction transistor $C_V$, which are connected in parallel, may improve the limit of the clamping current. Compared to the conventional TVS diode composed of the Zener diode, the semiconductor device layout structure 500d may improve the limit of the clamping current. Therefore, the current clamping performance of the semiconductor device layout structure 500d is improved.

Embodiments provide a transient-voltage-suppression (TVS) diode. The TVS diode has excellent current clamping performance and good electrostatic discharge (ESD) protection robustness. Compared to the conventional TVS diode composed of the Zener diode, the unit cell of the TVS diode (the semiconductor device layout structures 500a-500d) in accordance with some embodiments of the disclosure may improve the limit of the clamping current. The semiconductor device layout structure utilizes a Zener diode, a lateral bipolar junction transistor (lateral BJT) and a vertical bipolar junction transistor (vertical BJT) to collectively form a unit cell. Alternatively, the TVS diode layout structure in accordance with some embodiments of the disclosure may be further integrated with an additional polysilicon resistor or Schottky diode to be a unit cell. Due to the arrangement of the additional polysilicon resistor or Schottky diode, the size of the diode layout structure can be further reduced. Also, the TVS diode layout structure in accordance with some embodiments of the disclosure can clamp the current (the base current), which increases rapidly from the extreme low level to the high level, in a very small increase in voltage by triggering the lateral BJT and the vertical BJT. Additionally, the TVS diode layout structure may be arranged as an array to satisfy different requirements of the breakdown voltage and the current clamping performance.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A semiconductor device layout structure disposed in an active region of a semiconductor substrate, comprising:
   a first well region having a first conduction type;
   a second well region having a second conduction type opposite the first conduction type, wherein the second well region is disposed adjacent to and enclosing the first well region;
   a first doped region having the second conduction type, disposed within the first well region;

a second doped region having the second conduction type, disposed within the first well region, wherein the second doped region is separated from and surrounds the first doped region;

a third doped region having the second conduction type, disposed within the second well region;

a fourth doped region having the first conduction type and disposed within the first well region, wherein the fourth doped region is positioned directly under the first doped region;

a fifth doped region having the second conduction type and disposed within the first well region, wherein the fifth doped region is positioned directly under the first doped region and surrounding the fourth doped region;

a first isolation feature disposed on the semiconductor substrate and on an interface between the first well region and the second well region; and a polysilicon pattern disposed on a top surface of the first isolation feature, wherein the semiconductor device layout structure includes a diode, the first doped region and the third doped region are coupled to a first node, the second doped region and the polysilicon pattern are coupled to a second node, and wherein the first node is served as a cathode of the diode, and the second node is served as an anode of the diode.

2. The semiconductor device layout structure as claimed in claim 1, wherein the first doped region is coupled to the third doped region.

3. The semiconductor device layout structure as claimed in claim 2, wherein the diode is a Zener diode, the first doped region, the fourth doped region and the first well region collectively form the Zener diode, wherein the first doped region serves as a cathode of the Zener diode, the fourth doped region and the first well region serve as an anode of the Zener diode.

4. The semiconductor device layout structure as claimed in claim 3, wherein the first doped region, the fifth doped region, the first well region and the second doped region collectively form a first bipolar junction transistor, wherein the first doped region and the fifth doped region serve as a collector of the first bipolar junction transistor, the first well region serves as a base of the first bipolar junction transistor, and the second doped region serves as an emitter of the first bipolar junction transistor.

5. The semiconductor device layout structure as claimed in claim 4, wherein the third doped region, the second well region, the first well region and the second doped region collectively form a second bipolar junction transistor, wherein the third doped region and the second well region serve as a collector of the second bipolar junction transistor, the first well region serves as a base of the second bipolar junction transistor, and the second doped region serves as an emitter of the second bipolar junction transistor.

6. The semiconductor device layout structure as claimed in claim 5, wherein the first bipolar junction transistor and the second bipolar junction transistor are connected in parallel, and wherein the cathode of the Zener diode is coupled to the collector of the first bipolar junction transistor and the collector of the second bipolar junction transistor, the anode of the Zener diode is coupled to the base of the first bipolar junction transistor and the base of the second bipolar junction transistor.

7. The semiconductor device layout structure as claimed in claim 5, wherein the second doped region and the third doped region are positioned opposite sides of the first isolation feature.

8. The semiconductor device layout structure as claimed in claim 1, wherein the second doped region is coupled to the polysilicon pattern, wherein the polysilicon pattern is coupled to the first well region through a conductive pattern, which is in direct contact with the first well region.

9. The semiconductor device layout structure as claimed in claim 8, wherein the conductive pattern and the first well region collectively form a Schottky diode, wherein the first well region serves as an anode of the Schottky diode, the conductive pattern serves as a cathode of the Schottky diode, and wherein the polysilicon pattern forms a resistor.

10. The semiconductor device layout structure as claimed in claim 9, wherein the diode is a Zener diode, and the anode of the Schottky diode is coupled to the anode of the Zener diode, the base of the first bipolar junction transistor and the base of the second bipolar junction transistor.

11. The semiconductor device layout structure as claimed in claim 9, wherein the cathode of the Schottky diode is coupled to the emitter of the first bipolar junction transistor and the emitter of the second bipolar junction transistor through the resistor.

12. The semiconductor device layout structure as claimed in claim 1, further comprising:
    a second isolation feature disposed on the semiconductor substrate and in the first well region, wherein the second isolation feature is positioned between the second doped region and the first isolation feature, so that a portion of the first well region is exposed from a portion of the top surface of the semiconductor substrate, which is surrounded by the first isolation feature and the second isolation feature.

13. The semiconductor device layout structure as claimed in claim 1, further comprising:
    a second isolation feature disposed on the semiconductor substrate and in the first well region, wherein the second isolation feature is positioned between the second doped region and the first isolation feature; and
    a sixth doped region disposed in the first well region, wherein the first isolation feature and the second isolation feature collectively surround the sixth doped region.

14. The semiconductor device layout structure as claimed in claim 13, wherein the first doped region is positioned a center of the first well region, the sixth doped region has a repeatable arrangement by rotating the sixth doped region along an outer-paper direction of a normal line of a central point of the first well region with a rotating period of multiples of 180 degrees.

15. The semiconductor device layout structure as claimed in claim 13, wherein the sixth doped region is couple to the polysilicon pattern.

16. The semiconductor device layout structure as claimed in claim 15, wherein the second isolation feature has a repeatable arrangement by rotating the second isolation feature along an outer-paper direction of a normal line of a central point of the first well region with a rotating period of multiples of 180 degrees.

17. The semiconductor device layout structure as claimed in claim 13, wherein the sixth doped region has the first conduction type.

18. The semiconductor device layout structure as claimed in claim 17, wherein the diode is a Zener diode, the polysilicon pattern forms a resistor, and a first terminal of the resistor is coupled to the anode of the Zener diode, the base of the first bipolar junction transistor and the base of the second bipolar junction transistor.

19. The semiconductor device layout structure as claimed in claim 18, wherein a second terminal of the resistor is coupled to the emitter of the first bipolar junction transistor and the emitter of the second bipolar junction transistor.

20. The semiconductor device layout structure as claimed in claim 13, wherein the sixth doped region has the second conduction type.

21. The semiconductor device layout structure as claimed in claim 20, wherein the polysilicon pattern is coupled to the sixth doped region through a conductive pattern, which is in direct contact with the sixth doped region, and wherein the conductive pattern and the sixth doped region collectively form a Schottky diode, the polysilicon pattern forms a resistor, the conductive pattern serves as an anode of the Schottky diode, and the sixth doped region serves as a cathode of the Schottky diode.

22. The semiconductor device layout structure as claimed in claim 21, wherein the diode is a Zener diode, the cathode of the Schottky diode is coupled to the anode of the Zener diode, the base of the first bipolar junction transistor and the base of the second bipolar junction transistor, and the anode of the Schottky diode is coupled to the resistor.

* * * * *